United States Patent
Sawada et al.

(10) Patent No.: US 8,847,172 B2
(45) Date of Patent: Sep. 30, 2014

(54) METHOD FOR AXIAL ALIGNMENT OF CHARGED PARTICLE BEAM AND CHARGED PARTICLE BEAM SYSTEM

(75) Inventors: Hidetaka Sawada, Tokyo (JP); Takeo Sasaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 415 days.

(21) Appl. No.: 13/297,628

(22) Filed: Nov. 16, 2011

(65) Prior Publication Data
US 2012/0119107 A1   May 17, 2012

(30) Foreign Application Priority Data
Nov. 16, 2010 (JP) .................... 2010-255836

(51) Int. Cl.
  H01J 37/00  (2006.01)
  H01J 37/147 (2006.01)
  H01J 37/153 (2006.01)
  H01J 37/26  (2006.01)

(52) U.S. Cl.
  CPC ....... *H01J 37/153* (2013.01); *H01J 2237/1501* (2013.01); *H01J 37/1471* (2013.01); *H01J 2237/262* (2013.01); *H01J 2237/1532* (2013.01); *H01J 37/26* (2013.01)
  USPC ............. 250/396 R; 250/396 ML; 250/306; 250/307; 250/310; 250/311

(58) Field of Classification Search
  CPC ............ H01J 37/153; H01J 2237/1501; H01J 2237/1516; H01J 2237/1532; H01J 2237/1534; H01J 37/145; H01J 37/1471
  USPC ....... 250/306, 307, 310, 311, 396 R, 396 ML
  See application file for complete search history.

(56) References Cited

U.S. PATENT DOCUMENTS
2008/0093563 A1 *   4/2008   Sawada et al. ............. 250/396 R

FOREIGN PATENT DOCUMENTS
| JP | 2008123999 A | 5/2008 |
|----|--------------|--------|
| JP | 2009054565 A | 3/2009 |

OTHER PUBLICATIONS
H. Sawada et al, "Correction of higher order geometrical aberration by triple 3-fold astigmatism field", Journal of Electron Microscopy, (2009), pp. 341-347, vol. 58(6).
H. Rose, "Outline of a spherically corrected semiaplanatic medium-voltage transmission electron microscope", Optik, (1990), pp. 19-24, vol. 85, No. 1.
H. Haider et al., "Electron microscopy image enhanced", Nature, (1998), pp. 768-769, vol. 392.
H. Sawada et al., "STEM imaging of 47-pm-separated atomic columns by a spherical aberration-corrected electron microscope with a 300-kV cold field emission gun", Journal of Electron Microscopy, (2009), pp. 357-361, vol. 58(6).

\* cited by examiner

*Primary Examiner* — Michael Maskell
(74) *Attorney, Agent, or Firm* — The Webb Law Firm

(57) ABSTRACT

A method for axial alignment of a charged particle beam relative to at least three stages of multipole elements and a charged particle beam system capable of making the axial alignment. Some parts of the orbit of the beam or the distributions of three astigmatic fields, or both, are simultaneously translated in a direction perpendicular to the optical axis such that astigmatisms of the same order and same type due to axial deviations between successive ones of the astigmatic fields cancel.

7 Claims, 4 Drawing Sheets

METHOD FOR AXIAL ALIGNMENT OF CHARGED PARTICLE BEAM AND CHARGED PARTICLE BEAM SYSTEM

BACKGROUND OF THE INVENTION

1. Field of the Invention

The present invention relates to a method of making axial alignment of a charged particle beam with at least three stages of multipole elements. The invention also relates to a charged particle beam system capable of making this axial alignment.

2. Description of Related Art

In a charged particle beam instrument (such as a transmission electron microscope (TEM) or scanning transmission electron microscope (STEM)), aberration correction is an essential technique for obtaining high spatial resolution. Especially, positive spherical aberration produced by an objective lens is a typical factor to limit spatial resolution (see H. Sawada et al., Journal of Electron Microscopy, vol. 58 (2009), pp. 341-347).

Today, it is widely known that this positive spherical aberration can be corrected by the use of negative spherical aberration produced by hexapole elements or the like. A hexapole element produces a three-fold astigmatism that is a second-order aberration. In spherical aberration correctors, hexapole elements of this construction are arranged in two stages such that their three-fold astigmatisms cancel out each other (see H. Rose, Optik, Vol. 85 (1990), pp. 19-24 and H. Haider et al., Nature, vol. 392 (1998), pp. 768-769).

The aforementioned aberration correction technique is fundamentally correction of third-order spherical aberration. Corrections up to the fourth-order aberration can be made by axial alignment, which can be achieved using an optical system. A fifth-order spherical aberration can be corrected if the distance between the objective lens and the aberration corrector is controlled optically. However, corrections up to still higher orders of aberrations cannot be achieved completely. On the other hand, correction of astigmatism of the same order (fifth order) (i.e., six-fold astigmatism) is not yet achieved. Therefore, in a spherical aberration corrector consisting of two stages of hexapole elements, six-fold astigmatism is a major aberration which remains after correction of third-order spherical aberration and which is a factor limiting spatial resolution. Where six-fold astigmatism cannot be corrected, further improvement of spatial resolution cannot be anticipated.

Therefore, in the aberration corrector of JP-A-2009-054565, three stages of three-fold fields are used to correct six-fold astigmatism. In this aberration corrector, three-fold symmetric fields produced by the middle and rear stages of multipole elements are distributed in certain rotational relationships to the three-fold symmetric field produced by the front stage of multipole element within the plane perpendicular to the optical axis.

When axial alignment of an electron beam with multipole elements is made, it is customary to deflect the beam using a deflector or the like. In the case of an imaging system aberration corrector, deflection for the axial alignment is done while grasping residual aberration in the aberration corrector having multipole elements by tilting the beam relative to an amorphous sample, taking an image of the sample, and subjecting the image to Fourier transformation. In the case of this illumination system aberration corrector, the processing is continued until a geometrical figure of a desired shape is obtained while monitoring variations in the distortion of the geometrical figure, known as a Ronchigram, which is observed on a diffraction plane when the electron beam is focused onto the sample. In the case of a two-stage multipole element system, the source of appearing aberration has been identified and so it is relatively easy to make axial alignment of the beam with both multipole elements.

In the case of axial alignment with three or more stages of multipole elements, if the axial alignment with the first stage of multipole element produces a new aberration, it is very difficult to identify which of the middle and rear stages of multipole elements has brought about the aberration. If a further stage of multipole element is added, the difficulty increases vastly. Accordingly, a quite long time would be consumed in making the axial alignment.

SUMMARY OF THE INVENTION

The present invention has been made to solve the foregoing problem. It is an object of the invention to provide a method of making axial alignment of a charged particle beam with at least three stages of multipole elements. It is another object to provide a charged particle beam system capable of making this axial alignment.

A first embodiment of the present invention provides a method of making axial alignment of a charged particle beam in a charged particle beam system. In this method, at least three astigmatic fields are produced. Parts of the orbit of the charged particle beam or distributions of the astigmatic fields, or both, are moved simultaneously along a direction perpendicular to the optical axis such that astigmatisms of the same order and same type due to axial deviations between successive ones of the astigmatic fields cancel out each other.

A second embodiment of the invention provides a method of making axial alignment of a charged particle beam in a charged particle beam system. In this method, at least 3 three-fold astigmatic fields are produced. A pair of transfer lenses consisting of two rotationally symmetric lens fields is formed between any adjacent two of the astigmatic fields such that planes on the three-fold astigmatic fields are transferred as equivalent planes to their downstream astigmatic fields. Thus, first axial alignments of the charged particle beam with the three-fold astigmatic fields are made simultaneously.

A third embodiment of the invention provides a method of making axial alignment of a charged particle beam in a charged particle beam system. In this method, 3 three-fold astigmatic fields are produced. The three-fold astigmatic fields are present on planes of multipole elements. A pair of transfer lenses for transferring the multipole element planes to their downstream multipole element planes is formed between any adjacent two of the astigmatic fields. The intensities of the three-fold astigmatic fields are varied simultaneously while maintaining the summation of three-fold astigmatisms produced by the three-fold astigmatic fields at zero at all times. Preferably, the difference between the phase angles of the three-fold astigmatic fields located on the most upstream side and on the most downstream side, respectively, of the 3 three-fold astigmatic fields is approximately (70.5/3)°.

A fourth embodiment of the invention provides a charged particle beam system having at least three stages of multipole elements for producing astigmatic fields and deflectors mounted between the multipole elements. The deflectors translate parts of the orbit of a charged particle beam simultaneously along a direction perpendicular to an optical axis such that astigmatisms of the same order and same type due to axial deviations between successive ones of the multipole elements cancel out each other.

A fifth embodiment of the invention provides a charged particle beam system having at least three stages of multipole elements for producing astigmatic fields and a moving mechanism for translating the at least three stages of multipole elements separately in a direction perpendicular to an optical axis. The moving mechanism translates the multipole elements simultaneously such that astigmatisms of the same order and same type due to axial deviations between successive ones of the multipole elements cancel out each other.

A sixth embodiment of the present invention provides a charged particle beam system having at least three stages of multipole elements for producing astigmatic fields, pairs of transfer lenses mounted between the multipole elements, each pair of transfer lenses producing a pair of rotationally symmetric fields to transfer planes equivalent to planes formed by the multipole elements to their downstream multipole elements, and a moving mechanism for translating the multipole elements or the transfer lenses, or both, separately in a direction perpendicular to an optical axis. The moving mechanism carries out the translations simultaneously such that astigmatisms of the same order and same type due to axial deviations between successive ones of the multipole elements cancel out each other.

A seventh embodiment of the present invention provides a charged particle beam system having at least three stages of multipole elements for producing three-fold astigmatic fields, pairs of transfer lenses mounted between successive ones of the multipole elements such that each pair of transfer lenses produces a pair of rotationally symmetric fields to transfer planes equivalent to planes formed by the multipole elements to their downstream multipole elements, and first deflectors mounted between the transfer lenses of each pair. The first deflectors simultaneously perform deflections for making parts of the orbit of the charged particle beam strike the optical axis obliquely.

An eighth embodiment of the invention provides a charged particle beam system having three stages of multipole elements for producing three-fold astigmatic fields, first deflectors mounted upstream of the multipole elements, and transfer lenses of a pair mounted upstream and downstream, respectively, of the first deflectors. The transfer lenses produce a pair of rotationally symmetric fields to transfer planes equivalent to planes formed by the multipole elements to their downstream multipole elements. The multipole elements vary the intensities of the three-fold astigmatic fields simultaneously while maintaining the summation of three-fold astigmatisms produced by the three-fold astigmatic fields at zero at all times. Preferably, the difference between the phase angles of the three-fold astigmatic fields produced respectively by the multipole elements located on the most upstream side and on the most downstream side, respectively, of the three stages of multipole elements is approximately $(70.5/3)°$.

According to the present invention, axial alignment can be made while paying attention to only certain aberration by simultaneously controlling parts of the orbit of the charged particle beam incident on the astigmatic fields or the astigmatic fields or the rotationally symmetric fields acting on the charged particle beam. In other words, aberrations other than the certain aberration that is produced when the parts of the orbit, astigmatic fields, or rotationally symmetric fields are controlled separately do not appear. Consequently, the axial alignment is facilitated. This reduces the burden on the operator and can contribute to a decrease in the alignment time.

DESCRIPTION OF THE PREFERRED EMBODIMENTS

First Embodiment

A method of making axial alignment of a charged particle beam and its principle are described, the method being associated with a first embodiment of the present invention.

Figure 1:
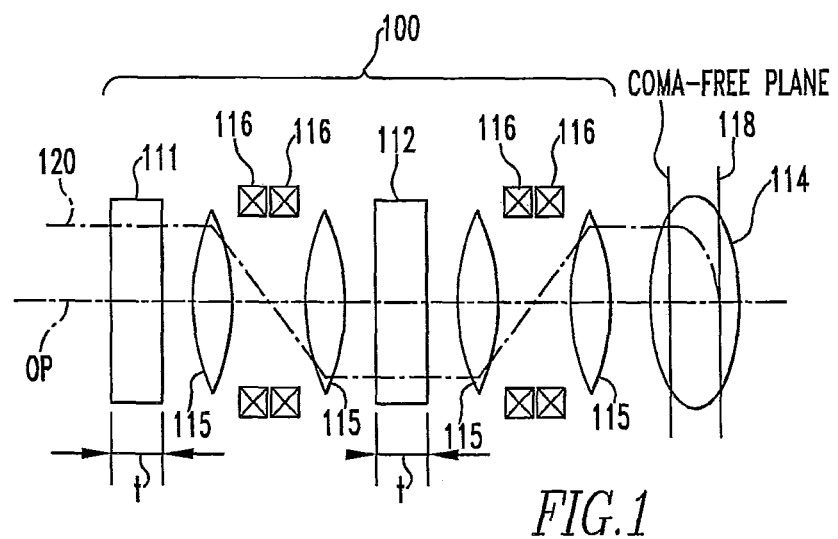
FIG. 1 is a diagram illustrating the principle of a method of making axial alignment of a charged particle beam, the method being associated with a first embodiment of the present invention.

Referring to FIG. 1, as a comparative example for the present embodiment, an aberration corrector 100 having two stages of multipole elements 111 and 112 is assumed. In the corrector 100, the multipole elements 111 and 112 are arrayed in a line along an optical axis OP. Each of the multipole elements 111 and 112 produces an N-fold astigmatic field (where N is an integer). For convenience of illustration, it is assumed that N=3. An N-fold astigmatic field means a field in which the intensity of the produced field varies with a period of 360/N degrees around the rotationally symmetric axis of the multipole element.

Preferably, each of the multipole elements 111 and 112 is made of a hexapole element or a dodecapole (12-pole) element. Note that no limitations are imposed on the number of poles. The produced three-fold astigmatic field is a static electric field, a static magnetic field, or a superimposition thereof.

Each of the multipole elements 111 and 112 has a thickness oft along the optical axis OP. The three-fold astigmatic field produced by each multipole element is termed the primary term of the field produced by the multipole element. Generally, a multipole element produces fields owing to higher-order terms other than the primary term though they are quite weak. In an ordinary multipole element having no thickness (so-called a thin multipole element), fields due to higher-order terms other than the primary term are neglected for the intended purpose of the multipole element or merely parasitic factors. However, if the thickness of the multipole element is increased, higher-order terms other than the primary term exhibit effects, which can be used for correction of spherical aberration. That is, a multipole element having thickness t along the optical axis OP creates a field owing to higher-order terms applicable to correction of spherical aberration other than the primary term. The thickness t may be different between the individual multipole elements.

An objective lens 114 is mounted downstream of the multipole element 112. A pair of transfer lenses 115 consisting of two axisymmetric lenses is mounted between the multipole elements 111 and 112. Similarly, another pair of transfer lenses 115 is mounted between the multipole element 112 and the objective lens 114. Each of the transfer lenses 115 transfers (projects) a plane (having a magnification of 1 times) equivalent to a plane formed by the multipole element 111 or 112 to the downstream multipole element 112 or to a coma-free plane of the objective lens 114.

Plural stages (for example, two stages as shown in FIG. 1) of deflectors 116 are mounted between the transfer lenses 115 of each pair to deflect an electron beam 120 (i.e., a charged particle beam) by the use of a magnetic or electric field in two mutually perpendicular directions perpendicular to the optical axis OP such that some parts of the orbit of the beam 120 are translated.

Generally, axial deviation-induced aberrations in two N-fold astigmatic fields are (N−1)-fold astigmatisms. In particular, in the above-described configuration, if an axial deviation occurs in the two three-fold astigmatic fields, a new two-fold astigmatism occurs. This can be confirmed on a sample surface 118. This two-fold astigmatism can be removed by translation of the parts of the orbit of the electron beam 120 performed by the deflectors 116 mounted between the multipole elements 111 and 112. Consequently, the beam 120 passes on the rotationally symmetric axes of the multipole elements 111 and 112, thus completing the axial alignment.

Figure 2:
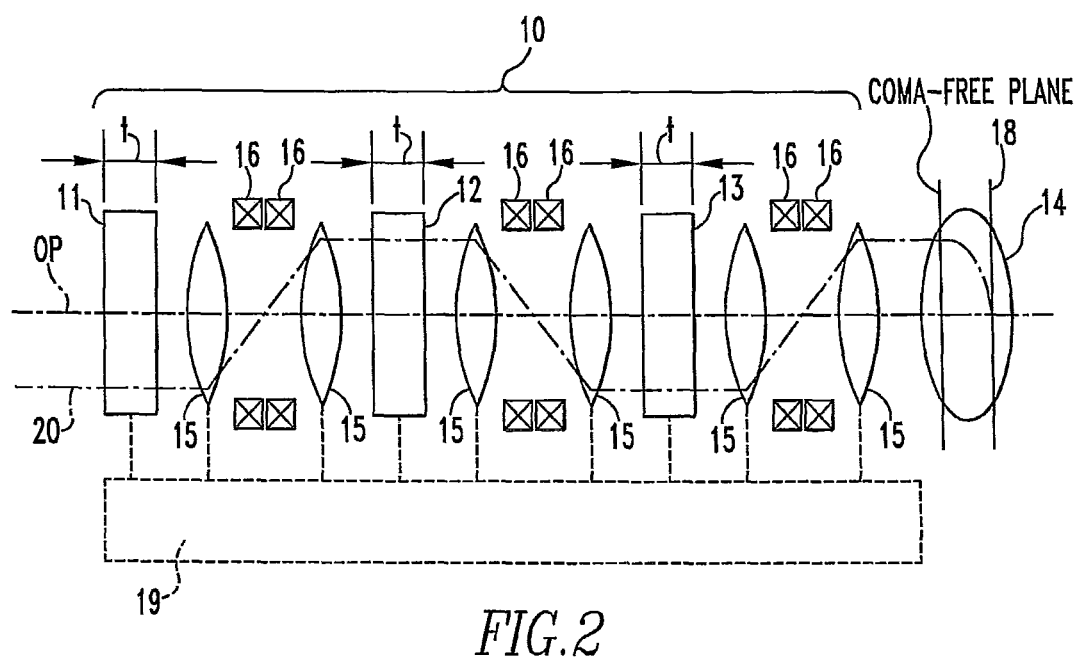
FIG. 2 is a schematic diagram of an aberration corrector associated with first through third embodiments of the invention.

A method of making axial alignment of the three stages of multipole elements is next described by referring to FIG. 2. An aberration corrector 10 includes at least three stages of multipole elements 11, 12, 13, a pair of transfer lenses 15 mounted between the multipole elements 11 and 12, another pair of transfer lenses 15 mounted between the multipole elements 12 and 13, a further pair of transfer lenses 15 mounted between the multipole element 13 and an objective lens 14, and three sets of deflectors 16. Each set of deflectors 16 is located between the transfer lenses 15 of respective one pair. Since the multipole elements 11, 12, 13, the pairs of transfer lenses 15, and the deflectors 16 are identical in structure and functions with the multipole elements 111, 112, the pairs of transfer lenses 115, and the deflectors 116, respectively, shown in FIG. 1, their description is omitted.

As described previously, the axial deviation-induced aberration in a three-fold astigmatic field is a two-fold astigmatism. If axial deviation-induced aberrations occur between the multipole elements 11 and 12 and between the multipole elements 12 and 13, the axial deviation-induced aberrations are combined and appear on the sample surface 18.

However, unlike the two stages of multipole elements 111 and 112 shown in FIG. 1, the three stages of multipole elements 11, 12, and 13 produce two axial deviation-induced aberrations of the same order and the same type (i.e., 2 two-fold astigmatisms). Furthermore, it is impossible to discern which one of the axial deviation-induced aberrations is due to axial deviation of the two three-fold astigmatic fields produced either by the multipole elements 11 and 12 or by the multipole elements 12 and 13. In an attempt to remove these aberrations, it is conceivable to adjust the part of the orbit of the electron beam 20 incident on the multipole element 12 and then to adjust the part of the orbit incident on the multipole element 13. The first adjustment frequently superimposes a new aberration onto the axial deviation-induced aberration on the sample surface 18. Therefore, it is difficult to remove the axial deviation-induced aberrations while identifying the two-fold astigmatisms.

Accordingly, in the present embodiment, the electron beam is manipulated simultaneously between the multipole elements 12, 13, and 14 by making use of an optical action occurring by coupling of the 2 two-fold astigmatisms. As described in JP-A-2008-123999, in a case where 2 two-fold astigmatic fields are produced, a two-fold astigmatism and an axisymmetric dispersion occur. The dispersion is the action of a so-called concave lens. These actions are produced by an axial deviation between 2 three-fold astigmatic fields as exemplified in the present embodiment and by an axial deviation between other two N-fold astigmatic fields (N is an integer), as well as by an axial deviation between two-fold astigmatic fields.

In other words, the aforementioned concave lens action vanishes simultaneously with two-fold astigmatisms when the electron beam 20 passes on the rotationally symmetric axes of 2 two-fold astigmatic fields. In this case, the concave lens action that reduces the convex lens action of the objective lens vanishes and so the beam is most overfocused near the sample surface 18. That is, in the case of the three stages of multipole elements 11, 12, and 13 shown in FIG. 2, parts of the orbit of the beam 20 are translated relative to the multipole elements 12 and 13 at the same time to cancel out the two-fold astigmatism produced by an axial deviation between the multipole elements 11 and 12 and the two-fold astigmatism produced by an axial deviation between the multipole elements 12 and 13. The beam 20 exiting from the multipole element 13 is most overfocused around the sample surface 18. If the manipulation is stopped at this point, the beam 20 will pass on the rotationally symmetric axes of the multipole elements 11, 12, and 13, thus achieving an axial alignment.

Operations similar to the foregoing operations are performed in a case where there are four or more stages of multipole elements. That is, the parts of the orbit of the electron beam incident on the multipole elements, respectively, are translated simultaneously so as to cancel out appearing two-fold astigmatisms. The translational motions are stopped when the beam is most overfocused.

Figure 4:
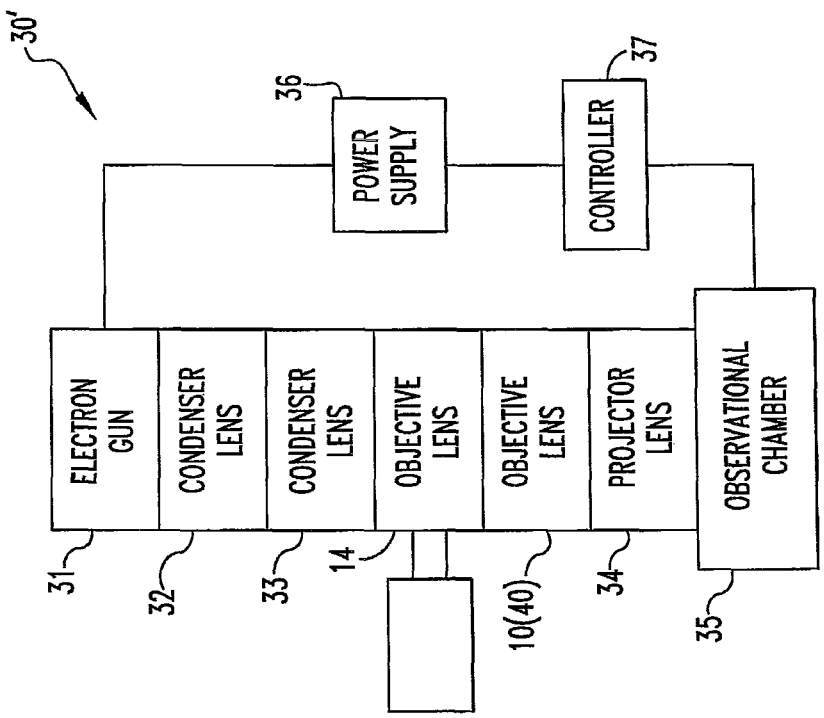
FIG. 4 is a schematic block diagram of one example of charged particle beam system associated with embodiments of the invention.
Figure 3:
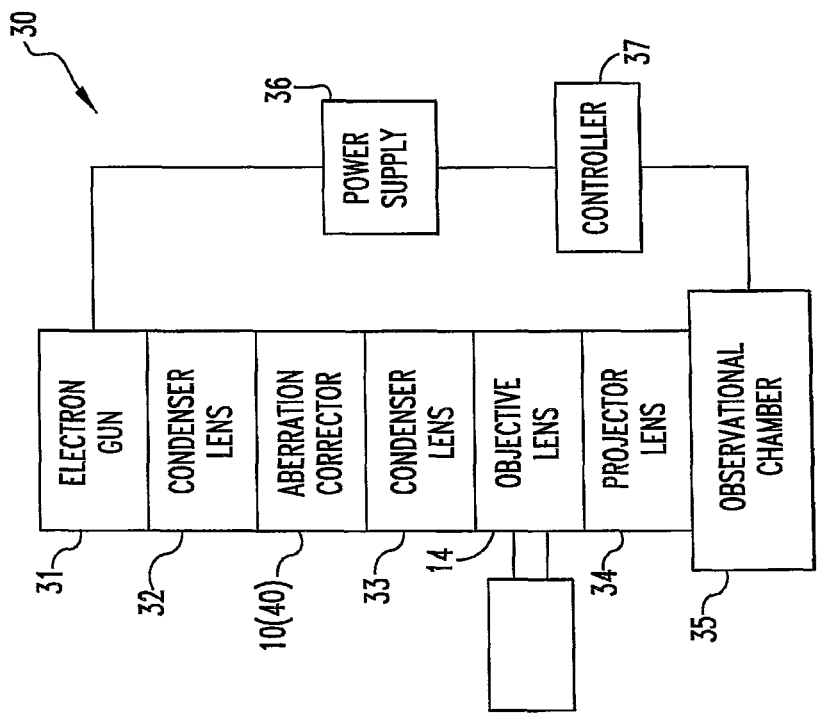
FIG. 3 is a schematic block diagram of one example of charged particle beam system associated with embodiments of the invention.

A charged particle beam system associated with a first embodiment of the present invention is next described by referring to FIGS. 3 and 4.

FIG. 3 schematically shows one example of charged particle beam system associated with embodiments of the invention. The charged particle beam system, indicated by numeral 30, is a transmission electron microscope, for example, and has an electron gun 31, a first condenser lens 32, the aforementioned aberration corrector 10, a second condenser lens 33, an objective lens assembly 14 including a sample stage (sample chamber), an intermediate/projector lens system 34, an observational chamber 35, and a power supply 36 for controlling the beam within the electron-optical column by applying voltages or currents to the optics. An aberration corrector and deflectors for axial alignment may be appropriately installed around the condenser lenses 32 and 33 to correct astigmatisms produced by the lenses 32 and 33.

Furthermore, the charged particle beam system 30 includes a controller 37 that controls the power supply 36 to set the voltages or currents applied to the optics including the first and second condenser lenses 32, 33 and the aberration corrector 10. Data stored in the storage portion (not shown)

within the controller 37 or values entered into the input portion of the controller 37 by an operator are used as those set values. Furthermore, the controller 37 displays an observation image obtained by the observational chamber 35.

The electron gun 31 produces an electron beam (not shown) in response to applied voltage and current values. A high voltage of several kV to hundreds of kV is impressed on the gun 31. The emitted electron beam (not shown) is accelerated toward the downstream first condenser lens 32 up to a desired energy. The beam is focused by the first condenser lens 32. Astigmatism is removed by the aberration corrector 10. Then, the beam is again focused by the second condenser lens 33. Astigmatic correcting elements, deflectors, apertures, and other components are appropriately installed upstream and downstream of the first condenser lens 32 and second condenser lens 33.

After passing through the aberration corrector 10, the beam is further focused in the objective lens assembly 14 and made to impinge on a sample placed on the sample stage. The beam transmitted through the sample is magnified by the intermediate/projector lens system 34 and hits a fluorescent screen (not shown) in the observational chamber 35. The sample image (real-space image, diffraction image, or the like) projected onto the fluorescent screen is picked up by an imaging device such as a CCD camera (not shown) and outputted as an image data to the controller 37.

FIG. 4 schematically shows another example of the charged particle beam system associated with embodiments of the invention. The charged particle beam system is indicated by numeral 30' and is a transmission electron microscope that is similar in configuration with the charged particle beam system 30 of FIG. 3 except that the aberration corrector 10 is installed between the objective lens assembly 14 and the intermediate/projector lens system 34. That is, the beam transmitted through the sample is subjected to an aberration correction made by the aberration corrector 10.

An operation for making axial alignment of the electron beam in a manner associated with the present embodiment using the aberration corrector 10 is next described by referring to FIGS. 2-4. First, the controller 37 controls the multipole elements 11, 12, and 13 to produce three-fold astigmatisms. The controller 37 then controls the deflectors 16 to deflect parts of the orbit of the electron beam 20 such that the parts of the orbit hit the multipole elements 12 and 13 at given angles of incidence.

The controller 37 then controls the deflectors 16 to translate the parts of the orbit of the beam 20 incident on the multipole elements 12 and 13 simultaneously in a direction perpendicular to the optical axis OP such that two-fold astigmatism produced by an axial deviation between the multipole elements 11 and 12 and two-fold astigmatism produced by an axial deviation between the multipole elements 12 and 13 cancel out each other. Because of the translational motions, the angles of incidence of parts of the orbit of the beam 20 to the multipole elements 12 and 13 do not vary. The controller 37 confirms the focal condition on the sample surface 18 during the translation motions. When the most overfocused state is achieved, the translational motions are stopped. The overfocused condition can be checked, for example, by performing known image processing on the observed image.

When the electron beam 20 is most overfocused on the sample, the two astigmatisms are completely removed. The beam 20 is allowed to pass on the rotationally symmetric axes of the multipole elements 11, 12, and 13.

Second Embodiment

A method of making axial alignment of a charged particle beam and a charged particle beam system associated with a second embodiment of the invention are next described.

The charged particle beam system associated with the present embodiment is similar to the system associated with the first embodiment except that the electron beam 20 is controlled differently than by the controller 37 of the first embodiment. Therefore, only the control provided by the controller 37 is described below.

In the method of making axial alignment in accordance with the first embodiment, parts of the orbit of the beam are translated so as to cancel out plural two-fold astigmatisms. A check is made as to whether the axial alignment has been achieved from variations of the focal condition during the translational motions. On the other hand, in the present embodiment, hexapole astigmatism that is a higher-order aberration produced by two adjacent three-fold astigmatic fields is noticed. As described below, when axial deviations occur among the multipole elements 11, 12, and 13 producing three-fold astigmatic fields, five-fold astigmatism is produced from six-fold astigmatisms which are produced, respectively, between the multipole elements 11 and 12 and between the multipole elements 12 and 13.

The generation of the five-fold astigmatism is now described by referring back to FIG. 1. It is assumed that the multipole elements 111 and 112 have thickness t along the optical axis OP and that the objective lens 114 has a focal distance of Let M be a magnification provided by the multipole elements 111, 112 and objective lens 114. Six-fold astigmatism (see non-patent document 3) is given by $$A_6 = \frac{\tilde{A}_3^2 |\tilde{A}_3|^2}{14 M^6 f^6} t^7 \tag{1}$$

where $\tilde{A}_3$ is a three-fold astigmatism per unit length produced in each of the multipole elements 111 and 112.

Then, it is assumed that the multipole elements 11, 12, and 13 are arranged along the optical axis in three stages as shown in FIG. 2. In the same way as the foregoing, each of the multipole elements 11, 12, and 13 creates a three-fold astigmatic field. As described previously, the objective lens assembly 14 of FIG. 2 is the same as the objective lens 114 of FIG. 1.

When an axial deviation occurs between the multipole elements of the optical system shown in FIG. 2, the two adjacent multipole elements 11 and 12 produce a six-fold astigmatism $A_6$. Similarly, the adjacent multipole elements 12 and 13 produce another six-fold astigmatism $A_6$. If these 6-fold astigmatisms $A_6$ produce an axial deviation T, its wave aberration is given by $$\mathrm{Re}\left\{\frac{1}{6} A_6 \overline{(\omega + T)}^6\right\} = \tag{2}$$
$$\mathrm{Re}\left\{\frac{1}{6} A_6 \left(\overline{\omega}^6 + 6\overline{T}\overline{\omega}^5 + 15\overline{T}^2\overline{\omega}^4 + 20\overline{T}^3\overline{\omega}^3 + 15\overline{T}^4\overline{\omega}^2 + 6\overline{T}^5\overline{\omega} + \overline{T}^6\right)\right\}$$

where ω is a complex angle. The second term of the right side of Eq. (2) contains the fifth power of the complex angle ω, and it can be seen that it represents a five-fold astigmatism. This is identically equal to $$\mathrm{Re}\left\{\frac{1}{5} A_5 \overline{\omega}^5\right\}$$

Therefore, the second term of the right side of Eq. (2) means that a five-fold astigmatism whose amount is $5A_6 T$ is produced. That is, if the axial deviation T occurs between the 2 six-fold astigmatisms, each produced by two adjacent ones of the three stages of multipole elements 11, 12, and 13, then the above-described five-fold astigmatism is produced. Accordingly, in a case where the five-fold astigmatism (or, axial deviation-induced aberration) on the sample surface 18 has vanished, the electron beam 20 passes on the central axes (rotationally symmetric axes) of the multipole elements 11-13.

Fundamentally, an axial deviation-induced aberration is produced by the presence of two adjacent three-fold astigmatic fields accompanied by an axial deviation. Therefore, the number of the multipole elements (3-fold astigmatic fields) is not limited to three. For example, where four stages of multipole elements are arranged, a five-fold astigmatism is produced by axial deviations between three six-fold astigmatisms. Therefore, in this case, when the five-fold astigmatism vanishes on the sample, the charged particle beam passes on the central axes of the multipole elements, in the same way as the foregoing.

Axial alignment of an electron beam by a method associated with the present embodiment is next described. First, the controller 37 controls the multipole elements 11, 12, and 13 to produce three-fold astigmatic fields. Then, the controller 37 controls the deflectors 16 located between the multipole elements to deflect parts of the orbit of the electron beam 20 such that they hit the multipole elements at given angles of incidence.

The controller 37 controls the deflectors 16 positioned between the multipole elements to translate simultaneously those parts of the orbit of the beam 20 which hit the multipole elements 12 and 13, respectively, to translate these parts of the orbit in a direction perpendicular to the optical axis OP such that the two-fold astigmatism produced due to axial deviation of the multipole elements 11 and 12 and the two-fold astigmatism produced due to axial deviation of the multipole elements 12 and 13 cancel out each other. Because of the translational motions, the angles of incidence of the beam 20 to the multipole elements 12 and 13 do not vary. The controller 37 checks the five-fold astigmatism appearing on the sample surface 18 during the translational motions. When the five-fold astigmatism vanishes, the translational motions are stopped. This five-fold astigmatism can be checked, for example, by performing known image processing on the observed image.

Where the five-fold astigmatism vanishes on the sample surface 18, the electron beam 20 is passing on the rotationally symmetric axes of the multipole elements 12-13.

Third Embodiment

A method of making axial alignment of a charged particle beam in a manner associated with a third embodiment of the invention and a charged particle beam system for implementing the method are next described.

Referring still to FIGS. 1-3, a charged particle beam system associated with the present embodiment has a moving mechanism 19 for moving the multipole elements 11, 12, 13 or at least transfer lens pairs 15 between the multipole elements, in addition to the configuration of the charged particle beam system 30 or 30' of the first or second embodiment. Concomitantly, the controller 37 controls movement made by the moving mechanism 19. The third embodiment is similar to the first and second embodiments in other respects and so only the control provided by the moving mechanism 19 and controller 37 is described below.

The moving mechanism 19 is mounted, for example, in the electron optical column (not shown) of the charged particle beam system 30 or 30', and is a manipulator for independently moving the multipole elements 11, 12, 13 or at least the two transfer lens pairs 15 between the multipole elements in two directions perpendicular to the optical axis OP.

In the first and second embodiments, the aforementioned parts of the orbit of the electron beam 20 are translated to cancel out the two-fold astigmatisms produced between the multipole elements 11, 12, and 13. In the present embodiment, instead of translating parts of the orbit of the beam 20, the multipole elements 11, 12, and 13 are moved independently and simultaneously by the use of the moving mechanism 19 such that the two-fold astigmatisms cancel out each other. The multipole elements 11-13 are moved in directions perpendicular to the optical axis OP. Alternatively, the transfer lens pairs 15 between the multipole elements may be moved by the moving mechanism independently and simultaneously. Also, in this case, the transfer lenses 15 are moved in directions perpendicular to the optical axis OP.

The controller 37 controls the multipole elements 11, 12, and 13 to produce three-fold astigmatic fields. The controller 37 then controls the deflectors 16 to deflect the electron beam 20 such that the beam 20 enters the multipole elements at given angles of incidence.

The controller 37 then translates the multipole elements 11, 12, and 13 independently and simultaneously by controlling the moving mechanism 19 such that the two-fold astigmatism produced by an axial deviation between the multipole elements 11 and 12 and the two-fold astigmatism produced by an axial deviation between the multipole elements 12 and 13 cancel out each other. Because of the translational motions, the angles of incidence of the parts of the orbit of the beam 20 hitting the multipole elements 12 and 13 do not vary. The controller 37 checks the focal condition or five-fold astigmatism appearing on the sample surface 18 during the translational motions. When the beam is most overfocused or the five-fold astigmatism vanishes, the controller stops the translational motions.

As described already in the first and second embodiments, when the beam is most overfocused or the five-fold astigmatism vanishes on the sample surface 18, the two-fold astigmatisms are completely removed. The electron beam 20 is passing on the rotationally symmetric axes of the multipole elements 11, 12, and 13.

In the axial alignment making method and charged particle beam system associated with the first through third embodiments, a variation in the focal state or five-fold astigmatism is utilized by translating parts of the orbit of the electron beam between multipole elements, the multipole elements, or transfer lens pairs in this way. Translational motions are done such that two-fold astigmatisms, i.e., axial deviation-induced aberrations, produced between the multipole elements cancel out each other. Consequently, axial alignment can be made while paying attention to only the focal state or five-fold astigmatism irrespective of the number of stages of multipole elements. Accordingly, the operation for making axial alignment is facilitated. This can contribute to a decrease in the observation time. Furthermore, the time taken to manipulate the charged particle beam system is shortened. Hence, the burden on the operator can be reduced.

The aberration corrector 10 may be installed in an imaging optical system configured including an intermediate lens and a projector lens. Aberration correctors may be installed in both the imaging optical system and in a condenser optical system configured including the first condenser lens. In any case, the above-described advantageous effects can be obtained.

Fourth Embodiment

A method of making axial alignment of a charged particle beam in a manner associated with a fourth embodiment of the invention and a charged particle beam system for implementing the method are described.

Figure 5:
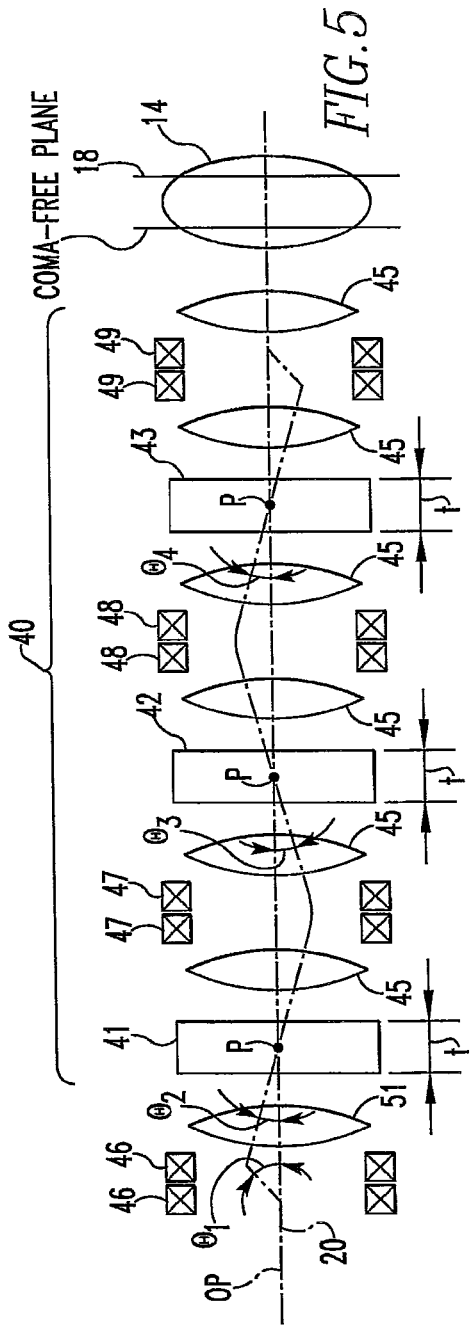
FIG. 5 is a schematic ray diagram of an aberration corrector associated with a fourth embodiment of the invention.

In the charged particle beam system associated with the present embodiment, an aberration corrector 40 shown in FIG. 5 is installed instead of the aberration corrector 10 of the first embodiment. Accordingly, the system of the fourth embodiment is similar to the charged particle beam system 30 or 30' of the first embodiment except that the aberration corrector 40 is installed and that the controller 37 controls the electron beam 20 in a different manner. The aberration corrector 40 and the control provided by the controller 37 are described below. Description of other configurations are omitted because they are identical with their counterparts of the first embodiment.

As shown in FIG. 5, the aberration corrector 40 associated with the fourth embodiment has at least three stages of multipole elements 41, 42, 43, a condenser lens 51 that is an axisymmetric lens mounted upstream of the multipole element 41 placed in the most front stage, pairs of transfer lenses 45 installed downstream of the multipole elements 41, 42, and 43, respectively, deflectors 46 mounted upstream of the condenser lens 51, and deflectors 47, 48, and 49 mounted between the transfer lenses 45 of their respective pairs. Each pair of transfer lenses 45 consists of two stages of axisymmetric lenses. Each of the multipole elements 41, 42, and 43 produces a three-fold astigmatic field, and is identical in structure with the multipole elements 11, 12, and 13 described in the first embodiment. The pairs of transfer lenses 45 are identical in structure with the pairs of transfer lenses 15 described in the first embodiment. The deflectors 46-49 are identical in structure with the deflectors 16 described in the first embodiment.

The condenser lens 51 focuses the electron beam 20, which has been deflected by the deflectors 46 located upstream of the condenser lens 51, toward the multipole element 41.

In the present embodiment, a first deflecting operation consisting of deflecting steps (1)-(3) and a second deflecting operation consisting of a deflection step (4) as described below are simultaneously carried out to achieve axial alignment together with correction of four-fold astigmatism. Angles $\theta_1$-$\theta_4$ given below are made between the optical axis OP and the electron beam 20. In FIG. 5, a counterclockwise direction is taken as a positive direction.

(1) As shown in FIG. 5, the controller 37 controls the deflectors 46 to deflect the electron beam 20 propagating on the optical axis OP once away from the axis OP by angle $\theta_1$. Then, the beam 20 is deflected toward the optical axis OP by angle $-\theta_2$ such that the beam strikes the multipole element 41 at an angle.

(2) The controller 37 controls the deflectors 47 to deflect the beam 20 exiting from the multipole element 41 at an angle of $-\theta_2$ such that the beam approaches the optical axis OP at an angle of $\theta_3$ and hits the multipole element 42 at an angle.

(3) The controller 37 controls the deflectors 48 to deflect the beam 20 leaving from the multipole element 42 at an angle of $\theta_3$ such that the beam approaches the optical axis OP at an angle of $-\theta_4$ and strikes the multipole element 43 at an angle.

(4) The controller 37 controls the deflectors 49 to deflect the beam 20 going out of the multipole element 43 at an angle of $-\theta_4$ such that the beam travels on the optical axis OP. The angles $\theta_1$ to $\theta_4$ are varied simultaneously in such a way that other first-order, second-order, and third-order aberrations are not produced.

While the deflecting steps (1)-(4) are being carried out simultaneously, only the four-fold astigmatism on the sample surface 18 varies. Where the deflecting steps are stopped when the four-fold astigmatism has disappeared, the electron beam 20 passes through the centers P of the multipole elements 41, 42, and 43, the centers being along the optical axis OP. That is, correction of the four-fold astigmatism and axial alignment of the beam 20 with the multipole elements 41, 42, and 43 are achieved.

In the combinations of the angles $\theta_1$-$\theta_4$, the polarity (positive or negative) of each angle may be reversed. For instance, in the deflecting step (1), if the beam 20 is deflected by an angle of $-\theta_1$, the deflection angle used thereafter is $\theta_2$.

As described also in the first embodiment, if parts of the orbit of the electron beam respectively hitting three or more stages of multipole elements are manipulated separately, various aberrations will appear on the sample surface 18. Therefore, it is difficult to identify aberrations used for axial alignment, thereby lengthening the adjustment. In the present embodiment, an axial alignment is made which uses a variation of four-fold astigmatism by employing simultaneous deflection of the parts of the orbit of the beam hitting the multipole elements. Consequently, it is easy to judge whether or not the axial alignment has been achieved. Accordingly, the operation for the axial alignment is facilitated. This can contribute to a decrease in the observation time. Furthermore, the charged particle beam system can be manipulated in a reduced time. As a result, the burden on the operator can be reduced.

For the sake of illustration, in the description of the present embodiment, an arrangement of three stages of multipole elements is taken as an example. The number of the multipole elements is not restricted to three. An axial alignment of four or more stages of multipole elements can be made while paying attention to only four-fold astigmatism.

Fifth Embodiment

A method of making axial alignment of a charged particle beam in accordance with a fifth embodiment of the invention and a charged particle beam system for implementing the method are described. The present embodiment is similar to the fourth embodiment except that the deflecting steps (2) and (3) of the first deflecting operation for the electron beam 20 are replaced by deflecting steps 2' and 3' for translating parts of the orbit of the beam relative to two multipole elements.

Figure 6:
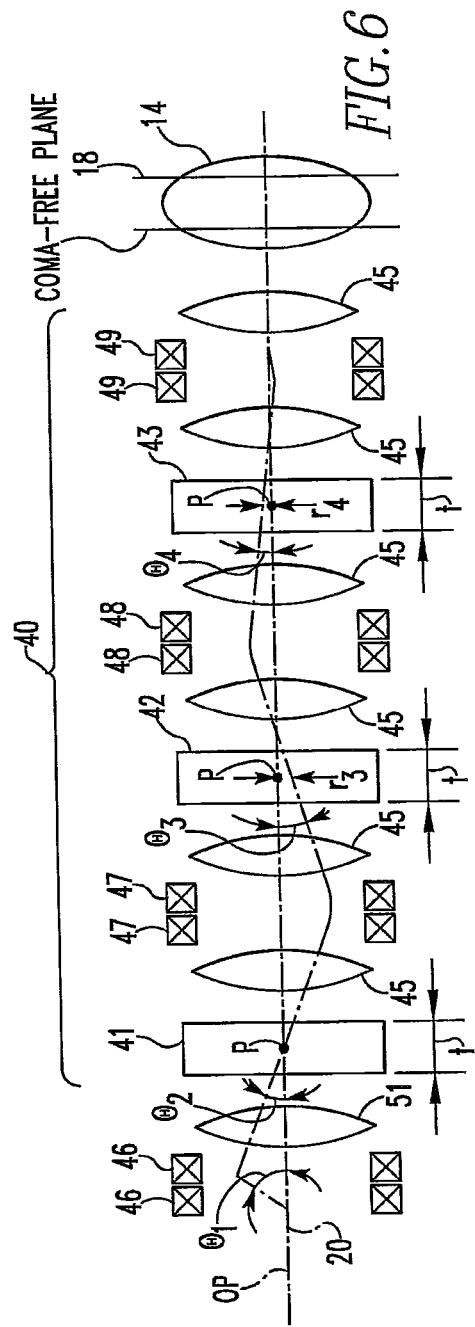
FIG. 6 is a schematic ray diagram of an aberration corrector associated with a fifth embodiment of the invention.

(1') As shown in FIG. 6, the controller 37 controls the deflectors 46 to deflect the electron beam 20 propagating on the optical axis OP such that the beam once goes away from the optical axis OP at an angle of $\theta_1$ and then to deflect the beam toward the optical axis OP at an angle of $-\theta_2$ and make the beam impinge on the multipole element 41 at an angle.

(2') The controller 37 controls the deflectors 47 to deflect the beam 20 exiting from the multipole element 41 at an angle of $-\theta_2$ in such a way that the beam moves toward the optical axis OP at an angle of $\theta_3$ and then to translate a part of the orbit of the beam 20 a distance of $r_3$ in a direction perpendicular to the optical axis OP such that the beam strikes the multipole element 42 at an angle.

(3') The controller 37 controls the deflectors 48 to deflect the beam 20 going out of the multipole element 42 at an angle of $\theta_3$ such that the beam approaches the optical axis OP at an angle of $-\theta_4$ and to translate a part of the orbit of the beam 20 a distance of $r_4$ in a direction perpendicular to the optical axis OP, thereby making the beam hit the multipole element 43 at an angle.

(4') The controller 37 controls the deflectors 49 to deflect the beam 20 exiting from the multipole element 43 at an angle of $-\theta_4$ such that the beam propagates on the optical axis OP.

The angles $\theta_1$-$\theta_4$ and distances $r_3$, $r_4$ are so set that other first-order, second-order, third-order, and fourth-order aberrations are not produced, and the angles and distances are varied at the same time.

While the deflections and translational motions are being made at the same time, only five-fold astigmatism on the sample surface 18 varies. Where the deflections are stopped at the instant when the five-fold astigmatism vanishes, the electron beam 20 passes through the centers P of the multipole elements 41, 42, and 43 taken along the optical axis OP. That is, correction of the five-fold astigmatism and axial alignment of the beam 20 with the multipole elements have been achieved.

In this way, in the axial alignment method and charged particle beam system associated with the fifth embodiment, variations of the five-fold astigmatism caused by simultaneous deflections and translational motions of the parts of the orbit of the electron beam hitting the multipole elements are utilized. Because of the deflections and the simultaneous translational motions, only the five-fold astigmatisms vary. Therefore, it is easy to judge whether or not an axial alignment has been achieved. Consequently, in the same way as in the fourth embodiment, it is easy to perform the operation for the axial alignment. This can contribute to a decrease in the observation time. Furthermore, the charged particle beam system can be manipulated in a reduced time. Hence, operator's burden can be reduced.

For convenience of illustration, in the description of the present embodiment, an arrangement of three stages of multipole elements is taken as an example. The number of stages of multipole elements is not restricted to three. An axial alignment of four or more stages of multipole elements can be made while paying attention to only four-fold astigmatism.

Furthermore, in the present embodiment, an axial alignment can also be attained by reversing the direction of propagation of the electron beam 20 and simultaneously effecting the aforementioned deflections and translational motions.

Sixth Embodiment

A method of making axial alignment of a charged particle beam in a manner associated with a sixth embodiment of the invention and a charged particle beam system for implementing the method are described.

The charged particle beam system associated with the present embodiment is similar in configuration to the charged particle beam system of the fourth embodiment except that three-fold astigmatic fields produced by the multipole elements 41, 42, and 43 are varied in intensity at the same time. Description of the configurations of the charged particle beam system associated with the present embodiment is omitted because the configurations are the same as their counterparts of the fourth embodiment, except for the manner in which the multipole elements 41, 42, and 43 are controlled by the controller 37.

Each of the three stages of multipole elements 41, 42, and 43 (see FIG. 5) associated with the present embodiment is, for example, a dodecapole (12-pole) element that produces a three-fold astigmatic field. In this optical system, the first multipole element 41 on the most upstream side, the second multipole element 42 located at an intermediate position, and the third multipole element 43 on the most downstream side produce three-fold astigmatisms which are herein denoted by $A_{31}$, $A_{32}$, and $A_{33}$, respectively.

H. Rose, Optik, Vol. 85 (1990), pp. 19-24 and H. Haider et al., Nature, vol. 392 (1998), pp. 768-769) state that, when the summation of these three-fold astigmatisms $A_{31}$, $A_{32}$, and $A_{33}$ becomes equal to 0 under the condition where the summation of any two of them does not cancel the summation of other two of them, the whole three-fold astigmatism is null.

FIGS. 7A-7B and 8A-8D show vectorial representations of three-fold fields. In the case of vectorial representations of a three-fold field, it is customary to use values that are three times greater than actual rotational relations of angles in the three-fold field within an optical or physical multipole element. According to this custom, when three stages of three-fold fields optically cancel out each other and the three-fold astigmatism becomes null, if vectorial representations are used, the combination of three vectors is geometrically null, which is easy to understand.

Figure 7A:
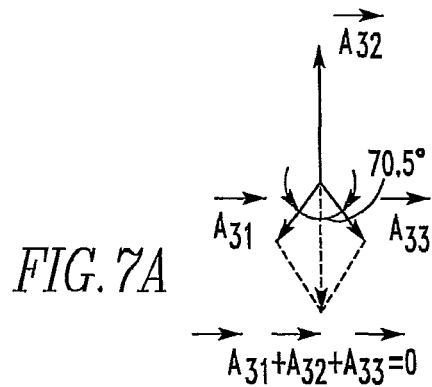
FIG. 7A is a diagram illustrating relations between three-fold astigmatisms in an aberration corrector associated with a sixth embodiment of the invention, as well as their variations.
Figure 7B:
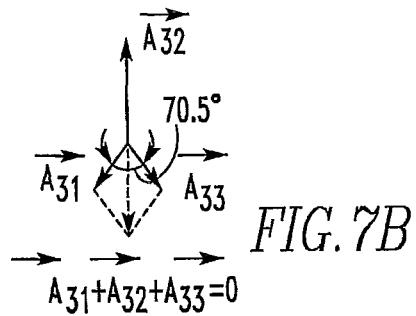
FIG. 7B is a diagram similar to FIG. 7A, but in which the three-fold astigmatisms are varied.

The main aberration remaining under the condition where the whole three-fold astigmatism is 0 is spherical aberration. Accordingly, if the intensity distribution of the three-fold astigmatic fields produced by the multipole elements 41, 42, and 43 is so varied that the summation of the 3 three-fold astigmatisms $A_{31}$, $A_{32}$, and $A_{33}$ is kept at 0 at all times, variations of the spherical aberration are prevalent. In FIGS. 7A and 7B, variations of the three-fold astigmatisms $A_{31}$, $A_{32}$, and $A_{33}$ are represented vectorially.

In particular, the distributions (amplitudes) of the three-fold astigmatic fields produced by the multipole elements 41-43 are varied while the summation of the 3 three-fold astigmatisms $A_{31}$, $A_{32}$, and $A_{33}$ is maintained at 0 by controlling the three-fold astigmatic fields produced by the multipole elements 41-43 by the use of the controller 37. If the variations are brought to a stop when the spherical aberration in the objective lens is reduced maximally, an axial alignment in which the whole spherical aberration has been most corrected can be accomplished.

Figure 8A:
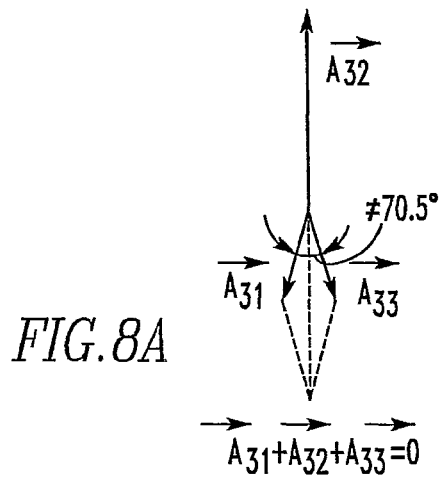
FIG. 8A is a diagram illustrating one example of relations between three-fold astigmatisms in an aberration corrector associated with the sixth embodiment of the invention, as well as their variations.
Figure 8B:
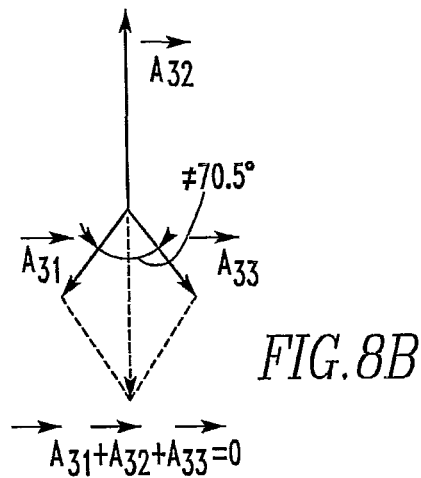
FIG. 8B is a diagram similar to FIG. 8A, but in which the three-fold astigmatisms are varied.
Figure 8C:
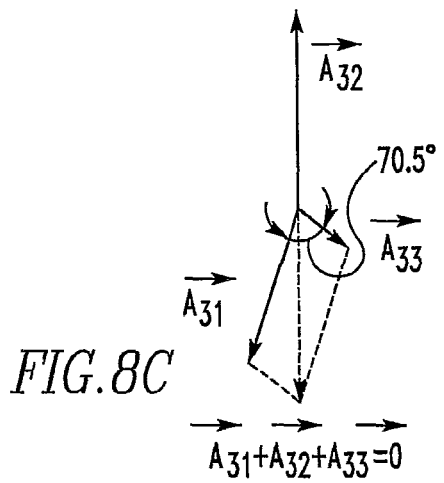
FIG. 8C is a diagram illustrating another example of relations between three-fold astigmatisms in the aberration corrector associated with the sixth embodiment of the invention, as well as their variations.
Figure 8D:
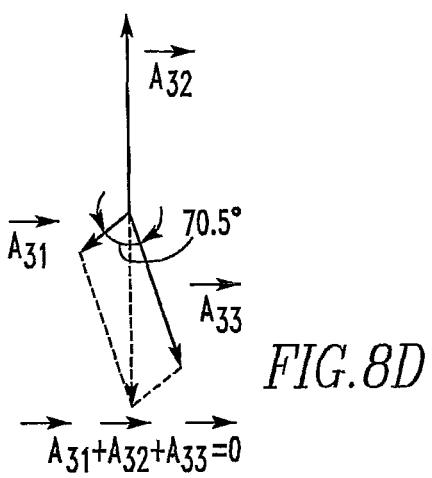
FIG. 8D is a diagram similar to FIG. 8C, but in which the three-fold astigmatisms are varied.

If the three-fold astigmatic fields produced by the three stages of multipole elements are manipulated separately as in the related art, varied aberrations appear on the sample surface 18. This makes it difficult to identify aberrations used for axial alignment and lengthens the adjustment. In the present embodiment, an axial alignment is made using variations of spherical aberration caused by simultaneous adjustment of the three-fold astigmatic fields produced by the multipole elements. Therefore, it is easy to judge whether or not the axial alignment has been achieved. Accordingly, the operation for the axial alignment is facilitated. This can contribute to a decrease in the observation time. Furthermore, the charged particle beam system is manipulated in reduced time. Consequently, operator's burden can be alleviated.

Where the intensities or rotational angles of three-fold fields are not set appropriately, three-lobe aberration that is a fourth-order aberration remains as shown in FIGS. 8A-8D. FIGS. 8A-8B are schematic diagrams showing states in which the phase angle difference between the three-fold astigmatism $A_{31}$ produced by the first multipole element 41 and the three-fold astigmatism $A_{33}$ produced by the third multipole element 43 is not $(70.5/3)°$. FIGS. 8C-8D are schematic diagrams showing states in which the phase angle difference between the three-fold astigmatism $A_{31}$ produced by the first multipole element 41 and the three-fold astigmatism $A_{33}$ produced by the third multipole element 43 is $(70.5/3)°$ but the aberrations $A_{31}$ and $A_{33}$ are not equal in intensity.

When the summation of the three-fold astigmatisms $A_{31}$, $A_{32}$, and $A_{33}$ produced by the multipole elements 41, 42, and 43 is 0 and the phase angle difference between the three-fold astigmatism $A_{31}$ produced by the first multipole element 41 and the three-fold astigmatism $A_{33}$ produced by the third multipole element 43 deviates from $(70.5/3)°$ as shown in FIGS. 8A and 8B, three-lobe aberration remains. On the other hand, when the three-fold fields are so set that the summation of the three-fold astigmatisms $A_{31}$, $A_{32}$, and $A_{33}$ produced by the multipole elements 41-43 is 0 and, at the same time, the phase angle difference between the three-fold astigmatism $A_{31}$ produced by the first multipole element 41 and the three-fold astigmatism $A_{33}$ produced by the third multipole element 43 is $(70.5/3)°$ but the astigmatisms $A_{31}$ and $A_{33}$ are not equal in intensity as shown in FIGS. 8C and 8D, three-lobe aberration remains. Accordingly, the distribution of the three-fold astigmatic fields produced by the multipole elements 41, 42, and 43 is so varied that the astigmatisms $A_{31}$ and $A_{33}$ are equal in intensity and that the phase angle difference between the three-fold astigmatism $A_{31}$ produced by the first multipole element 41 and the three-fold astigmatism $A_{33}$ produced by the third multipole element 43 is approximately $(70.5/3)°$. If this variation is brought to a stop when the spherical aberration in the objective lens or three-lobe aberration has been reduced to a minimum, an axial alignment in which the two aberrations have been most corrected as a whole can be achieved.

While embodiments of the present invention have been described so far, charged particle beam systems of the embodiments are not restricted to transmission electron microscopes. The charged particle beam systems of the embodiments can also be applied to scanning electron microscopes, scanning transmission electron microscopes, ion microscopes, focused ion microscopes, and similar other instruments.

Having thus described our invention with the detail and particularity required by the Patent Laws, what is desired protected by Letters Patent is set forth in the following claims.

The invention claimed is:

1. A method of making axial alignment of a charged particle beam in a charged particle beam system, said method comprising the steps of:
   producing at least three astigmatic fields; and
   translating parts of the orbit of the charged particle beam simultaneously along a direction perpendicular to an optical axis such that astigmatisms of the same order and same type due to axial deviations between successive ones of the astigmatic fields cancel out each other by deflectors mounted between said astigmatic fields.

2. A method of making axial alignment of a charged particle beam as set forth in claim 1, wherein each of said astigmatic fields is a three-fold astigmatic field, and wherein each of said astigmatisms is a two-fold or five-fold astigmatism.

3. A method of making axial alignment of a charged particle beam as set forth in claim 2, wherein each of said astigmatic fields is the two-fold astigmatic field, and wherein the translating step is terminated when the charged particle beam exiting from the astigmatic field distributed on the most downstream side of the at least three astigmatic fields is most overfocused.

4. A charged particle beam system comprising:
   at least three stages of multipole elements for producing astigmatic fields; and
   deflectors mounted between the multipole elements and operating to translate parts of the orbit of a charged particle beam simultaneously along a direction perpendicular to an optical axis such that astigmatisms of the same order and same type due to axial deviations between successive ones of the multipole elements cancel out each other.

5. A charged particle beam system as set forth in claim 4, further comprising pairs of transfer lenses mounted between the multipole elements, and wherein each pair of transfer lenses produces a pair of rotationally symmetric fields to transfer planes equivalent to planes formed by the multipole elements to their downstream multipole elements.

6. A charged particle beam system as set forth in any one of claims 4 and 5, wherein each of said astigmatic fields is a three-fold astigmatic field, and wherein each of said astigmatisms is a two-fold or five-fold astigmatism.

7. A charged particle beam system as set forth in claim 6, wherein each of said astigmatic fields is the two-fold astigmatic field, and wherein said deflectors terminate the simultaneous translational motions when the charged particle beam exiting from the multipole element located on the most downstream side of the at least three stages of multipole elements is most overfocused.

* * * * *